US012652775B2

(12) United States Patent 
Schubert et al.

(10) Patent No.: US 12,652,775 B2 
(45) Date of Patent: Jun. 9, 2026

(54) TRAY WITH MOVEABLE CONNECTOR FOR CHASSIS SIDE PLANE ENGAGEMENT

(71) Applicant: Microsoft Technology Licensing, LLC, Redmond, WA (US)

(72) Inventors: Alexis Grace Schubert, Seattle, WA (US); Martha G. Peterson, Woodinville, WA (US); Jorge Luis Juarez Campos, Bothell, WA (US); Daniel Afsheen Mohaghegh, Seattle, WA (US); Wade Doll, Enumclaw, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 119 days.

(21) Appl. No.: 18/621,945

(22) Filed: Mar. 29, 2024

(65) Prior Publication Data

US 2025/0261326 A1      Aug. 14, 2025

Related U.S. Application Data

(60) Provisional application No. 63/552,892, filed on Feb. 13, 2024.

(51) Int. Cl.
*H05K 7/14*           (2006.01)

(52) U.S. Cl.
CPC .................................. *H05K 7/1489* (2013.01)

(58) Field of Classification Search
None
See application file for complete search history.

(56) References Cited

U.S. PATENT DOCUMENTS

| | | | | |
|---|---|---|---|---|
| 5,657,204 A * | 8/1997 | Hunt | .................... | H05K 7/1409 |
| | | | | 361/752 |
| 6,411,517 B1 * | 6/2002 | Babin | .................. | H05K 7/1461 |
| | | | | 361/759 |
| 7,364,447 B1 * | 4/2008 | Desrosiers | .............. | G06F 1/186 |
| | | | | 439/372 |
| 8,848,358 B2 * | 9/2014 | Peng | ....................... | G06F 1/185 |
| | | | | 361/740 |
| 10,840,643 B1 * | 11/2020 | Jin | ........................ | H01R 12/722 |
| 2013/0021761 A1 * | 1/2013 | Peng | ....................... | G06F 1/185 |
| | | | | 361/748 |
| 2014/0254086 A1 * | 9/2014 | Li | ........................ | H05K 7/1489 |
| | | | | 439/64 |

* cited by examiner

*Primary Examiner* — Allen L Parker 
*Assistant Examiner* — Christopher L Augustin 
(74) *Attorney, Agent, or Firm* — Holzer Patel Drennan

(57)           ABSTRACT

A tray is adapted for insertion within a tray slot formed in a chassis. The tray includes a lever and a moveable connector that protrudes from and engages with a side plane of the chassis in response to rotation of the lever.

19 Claims, 7 Drawing Sheets

500

Top-Down View of Tray Sidewall

To Chassis Side Plane

501

Side View of Tray Sidewall

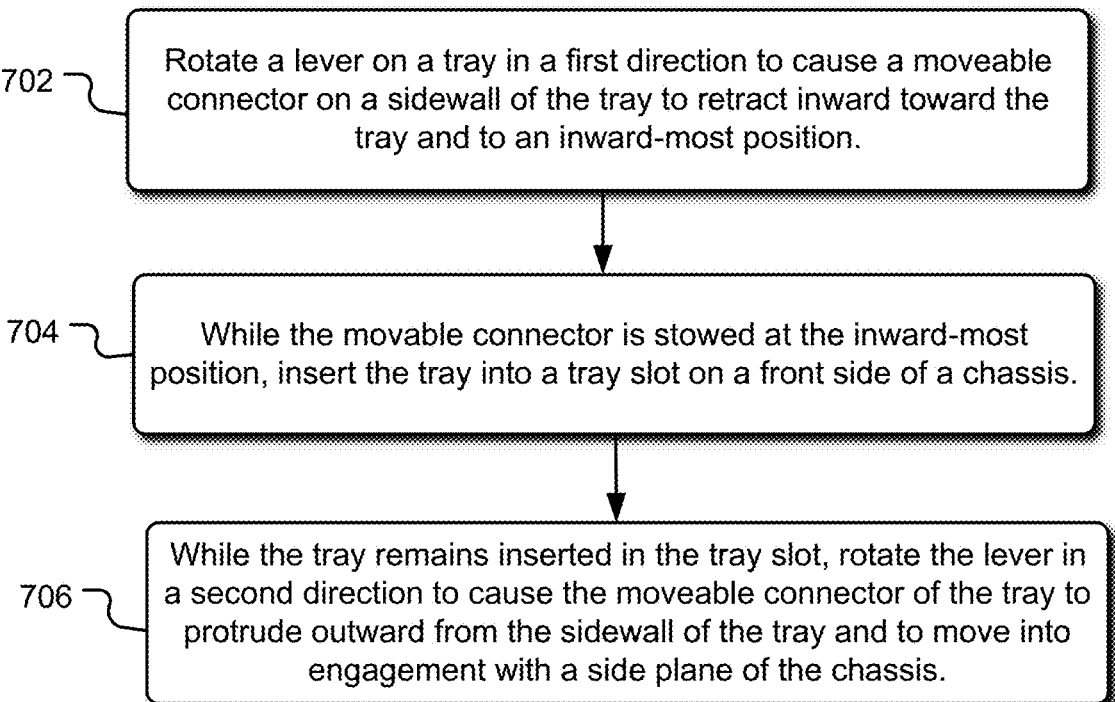

702 — Rotate a lever on a tray in a first direction to cause a moveable connector on a sidewall of the tray to retract inward toward the tray and to an inward-most position.

704 — While the movable connector is stowed at the inward-most position, insert the tray into a tray slot on a front side of a chassis.

706 — While the tray remains inserted in the tray slot, rotate the lever in a second direction to cause the moveable connector of the tray to protrude outward from the sidewall of the tray and to move into engagement with a side plane of the chassis.

FIG. 7

TRAY WITH MOVEABLE CONNECTOR FOR CHASSIS SIDE PLANE ENGAGEMENT

CROSS-REFERENCE TO RELATED APPLICATIONS

The present application claims benefit of priority to U.S. provisional patent application with Ser. No. 63,552,892 entitled "Chassis Side Plane Connection Design" which was filed on Feb. 13, 2024, which is hereby incorporated by reference for all that it discloses or teaches.

BACKGROUND

Within a data center, it is common to house servers in trays that slide in and out of corresponding slots (e.g., similar to drawers) in a rack or within a chassis that sits within the rack. In a common design, different servers are stored within different trays of a chassis. This chassis configuration advantageously allows each server to be serviced independently as a field-replaceable-unit (FRU). In a typical configuration, each tray in a chassis includes front-side ports that attach to many different cables coupled to external resources. In some configurations, it is also desirable to support data connectivity between trays. These configurations create challenges in space management, particularly in high density storage applications.

SUMMARY

According to one implementation, a system disclosed herein includes a tray adapted for insertion into a tray slot in a front side of a chassis. The tray includes a lever and a moveable connector that protrudes from a sidewall of the tray and that engages with a side plane of the chassis in response to rotation of the lever.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

BRIEF DESCRIPTION OF THE DRAWINGS

FIG. 7 illustrates example operation for engaging a compute resource tray with a chassis side plane according to an aspect of the herein disclosed technology.

DETAILED DESCRIPTION

Figure 1A:
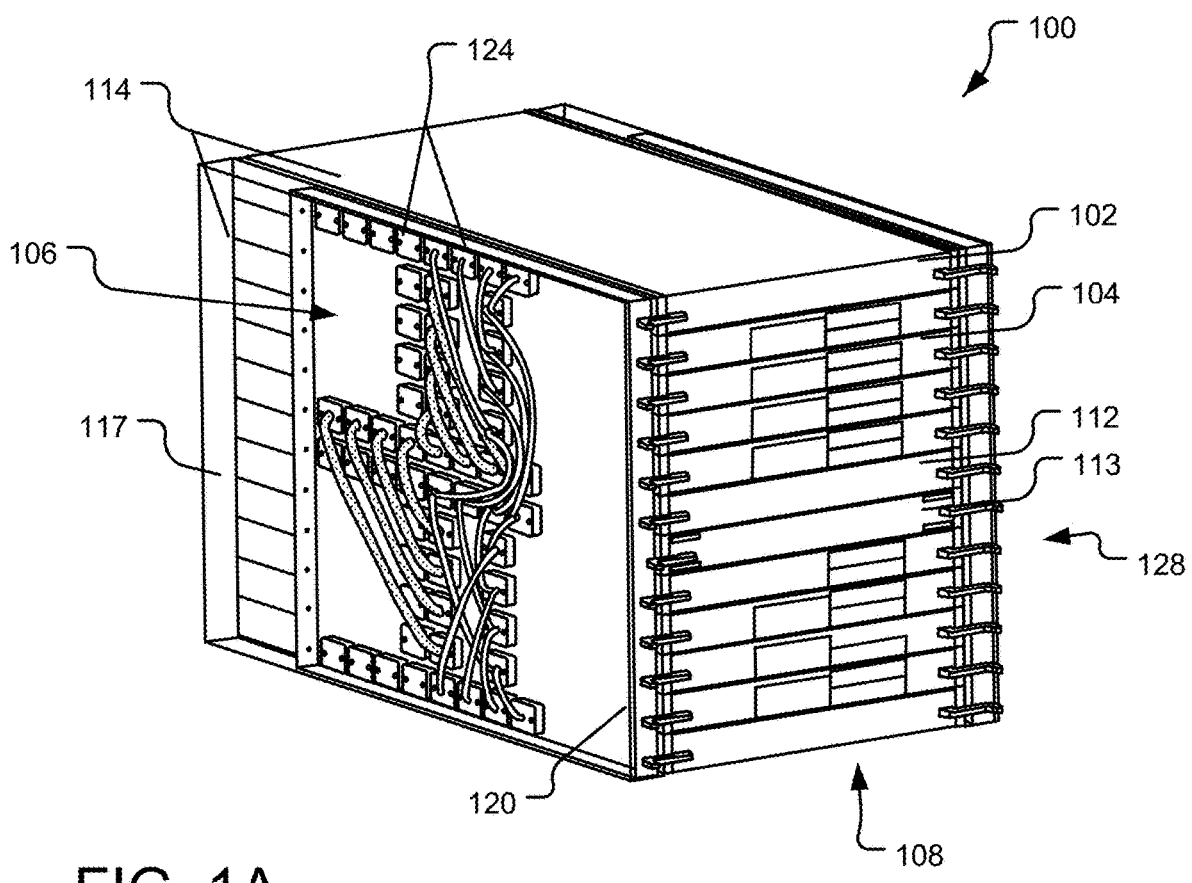
FIG. 1A illustrates an example chassis with multiple trays interconnected via a cabled side plane.

Common techniques for forging tray-to-tray electrical connections within a chassis include the use of cables on either the front side or back side of the chassis as well as dedicated backplanes, each of which presents its own unique challenges. The formation of tray-to-tray interconnects on the front side of the chassis can impede serviceability since trays are removed and re-inserted into slots on the front side of the chassis. While the back side of the chassis can be accessed without impeding serviceability, chassis cooling systems typically pull cool air from front to back and expel hot air on the chassis back-side, which can create unsafe human temperature conditions near chassis cooling system exhaust ports. Consequently, chassis designs that require operator access to the chassis back side (e.g., to connect tray-to-tray cables) present operator safety concerns.

In contrast to the above, a backplane advantageously eliminates external cables and instead includes a back-side PCB within the rack with dedicated electrical connectors that mate with corresponding connectors on server trays. However, backplanes impede airflow and therefore strain chassis cooling systems. In addition, since it is common for servers to be positioned near the front of their respective trays, long data channels may be needed to connect a server (near the front of the tray) with a backplane. These long data channels can impede signal quality.

The herein disclosed technology includes a chassis side plane connection design that facilitates tray-to-tray electrical connectivity while avoiding the aforementioned disadvantages of existing tray-to-tray connectivity solutions. The disclosed side plane design is, in one implementation, implemented in a chassis with left and right side planes that enable connections to the left and right sides of trays housed within the chassis. The herein-described side planes connections can support various types of connections including connections that enable disaggregation of resources, sharing of resources, provisioning of power, and/or provisioning of liquid cooling. In one implementation, the herein disclosed side plane design provides high-density interconnects, such as those utilized by AI applications when connecting GPUs to high-speed switches to form a high-count GPU PODS (Point of Delivery). A chassis implementing the disclosed side plane design can be designed to fit within a standard 19- or 23-inch rack, or can be deployed outside of a rack.

According to one implementation, a chassis side plane is adapted for insertion into a vertically-oriented panel slot in a front side of the chassis. The chassis side plane extends parallel to the sides of multiple stacked trays and includes connector ports adapted to receive and mate with connectors that protrude from side planes of various stacked trays. In one implementation, select connector ports of the side plane at different heights (e.g., corresponding to different trays) are connected to one another via cables prior to insertion of the side plane into the chassis so as to provide desired tray-to-tray connections without a need for an operator to configure cable connections while standing in the proximity of the chassis at a data center.

According to another implementation, each tray within the chassis includes one or more moveable tray-side connectors adapted to transition between a protruded state and a retracted state in response to selective user rotation of a lever or other actuation mechanism. For example, an operator inserts a tray into a chassis while tray-side connectors in the tray are stowed in a retracted position. Once the tray is in place, the operator rotates a lever on the tray to cause the tray-side connectors to protrude outward from the side of the tray and mate with a corresponding connector of the side plane chassis. In one implementation, an interlock system prevents the operator from moving the handle until the tray and side plane are aligned properly. These and other configurations are contemplated in greater detail with respect to the following figures.

FIG. 1A illustrates an example server chassis 100 with multiple trays (e.g., trays 102, 104, 112), interconnected via a side plane connection design. The sever chassis 100 comprises an outer frame 114 that houses multiple trays. Each of the trays is oriented in a horizontal direction parallel to a base 108 of the chassis 100 and adapted to support various computer hardware such as processing components, memory, storage, and/or network components. In the illustrated implementations, some of the trays contain servers (e.g., a server tray 104) and some of the trays contain hardware resources (e.g., network resource tray 102, memory resources tray 112, storage resources trays 113) that are shared between multiple servers positioned within different respective trays of the chassis 100.

Connections between different trays (e.g., server trays and the resource trays) are made via connections that occur on a side of the chassis. Specifically, sidewall 117 of the chassis 100 includes a side plane 106 that supports cable-based electrical connections between different trays. For instance, the resource trays 102, 112, and 113 are each shown to be connected to multiple different server trays via cable connection that extend between connection ports on the side plane 106.

In the illustrated implementation, the side plane 106 is shown internal to the outer frame 114 with sidewall 117 transparent to illustrate aspects of the side plane 106. The side plane 106 is oriented vertically within the chassis 100 (e.g., in a direction orthogonal to the chassis base 108). In one implementation, the side plane 106 is removeable from the chassis 100 and the connections on the side plane 106 are pre-configured prior to insertion of the side plane 106. Notably, the side plane 106 in other implementations of the disclosed technology may be non-removeable coupled to the chassis 100.

Each of the trays 102, 104, 112, 113 includes one or more moveable tray-side connectors (not visible in FIG. 1A) and an actuation mechanism (e.g., a lever 121) that can be selectably and bidirectionally engaged by a user to alter the position of moveable tray-side connectors between a retracted state and a protruded state. For example, rotating the lever 120 in a first direction causes the moveable tray-side connectors in the corresponding tray to retract inward toward (e.g., and at least partially within) a sidewall of the tray while rotating the lever 120 in a second opposite direction causes the moveable tray-side connectors in the corresponding tray to protrude outward from the side wall of the tray.

If the tray (e.g., the tray 102) is properly positioned within a tray slot of the chassis 100, transitioning the moveable try-side connectors from the retracted position to the protruded positions causes the moveable tray-side connectors to mate with corresponding connectors 124 of the side plane 106. When, in contrast, the moveable tray-side connectors are transitioned back to the retracted state, the moveable tray-side connectors are decoupled from the side plane 106, facilitating removal of the tray 102 from the chassis 100 through a corresponding tray slot in a front side 128 of the chassis.

Figure 1B:
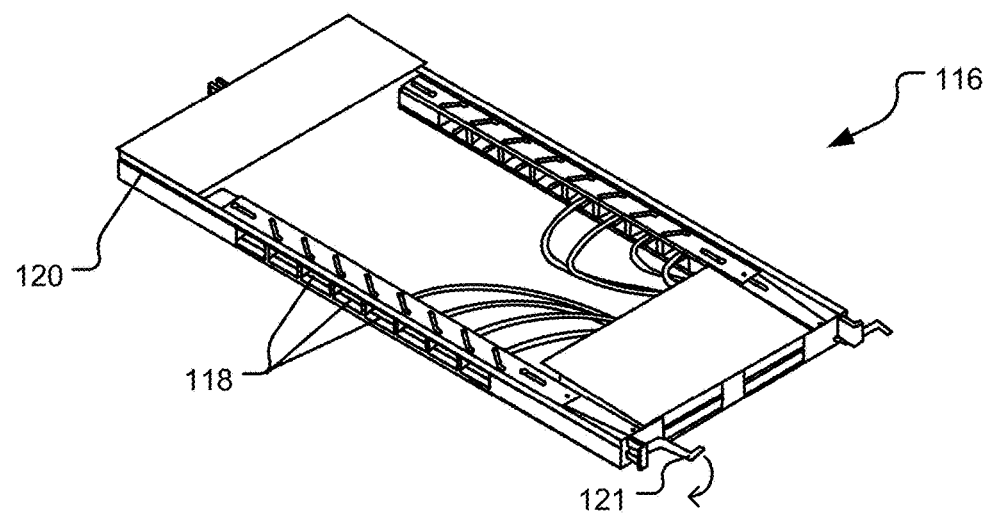
FIG. 1B illustrates an example tray with moveable tray-side connectors that are designed to mate with corresponding connectors of a side plane of the chassis shown in FIG. 1A.

FIG. 1B illustrates an example tray 116 with moveable tray-side connectors 118 (shown in a retracted state) that are designed to mate with corresponding connectors of the side plane 106 of the chassis 100 shown in FIG. 1A. The movable tray-side connectors 118 are adapted for bidirectional, single-axis movement along an axis substantially orthogonal to a sidewall 120 of the tray 116.

In FIG. 1B, the moveable tray-side connectors 118 are shown in a retracted state where the outward-most tip of each of the moveable tray-side connectors 118 is inward of the sidewall 120 of the tray 116. A rotatable lever 121 protrudes through the front face of the tray 116 and is accessible on the front side of the chassis 100 (in FIG. 1A) when the tray 116 is positioned within a corresponding horizontal slot (not shown) in the chassis 100. As the rotatable lever 121 is rotated in a first direction, the movable tray-side connectors 118 gradually begin to protrude from corresponding slots in the sidewall 120 of the tray 116 to come into contact and mate with a corresponding connector on the side plane 106.

In one implementation, the rotatable lever 121 is coupled to a moving assembly that uses a pin and slot design to transition the moveable tray-side connectors 118 to the protruded state in response to lever movement in a first direction and to transition the moveable tray-side connectors 118 back to the retracted state in response to lever movement in a second opposite direction. In this manner, rotation of the rotatable lever 121 causes the moveable tray-side connectors 118 to mate with corresponding connectors of the side plane 106, facilitating tray-to-tray electrical connections at locations that do not interfere with airflow near cooling system intake or exhaust (at the front and rear of the chassis 100, respectively).

In an implementation where the side plane 106 (of FIG. 1A) is configured with respective electrical connections (e.g., as shown) prior to insertion into the chassis 100, the above-described tray-to-tray electrical connections can be achieved via the side plane 106 without operator access to the back side of the chassis 100 where cooling system exhaust runs dangerously hot. Moreover, the above-described tray-to-tray connections can also be achieved without operator access to the side of the chassis (e.g., in proximity of the side plane 106), allowing for high-density distribution of racks within in a data center.

Further details of the illustrated side plane design are described in greater detail with respect to the following figures.

Figure 2:
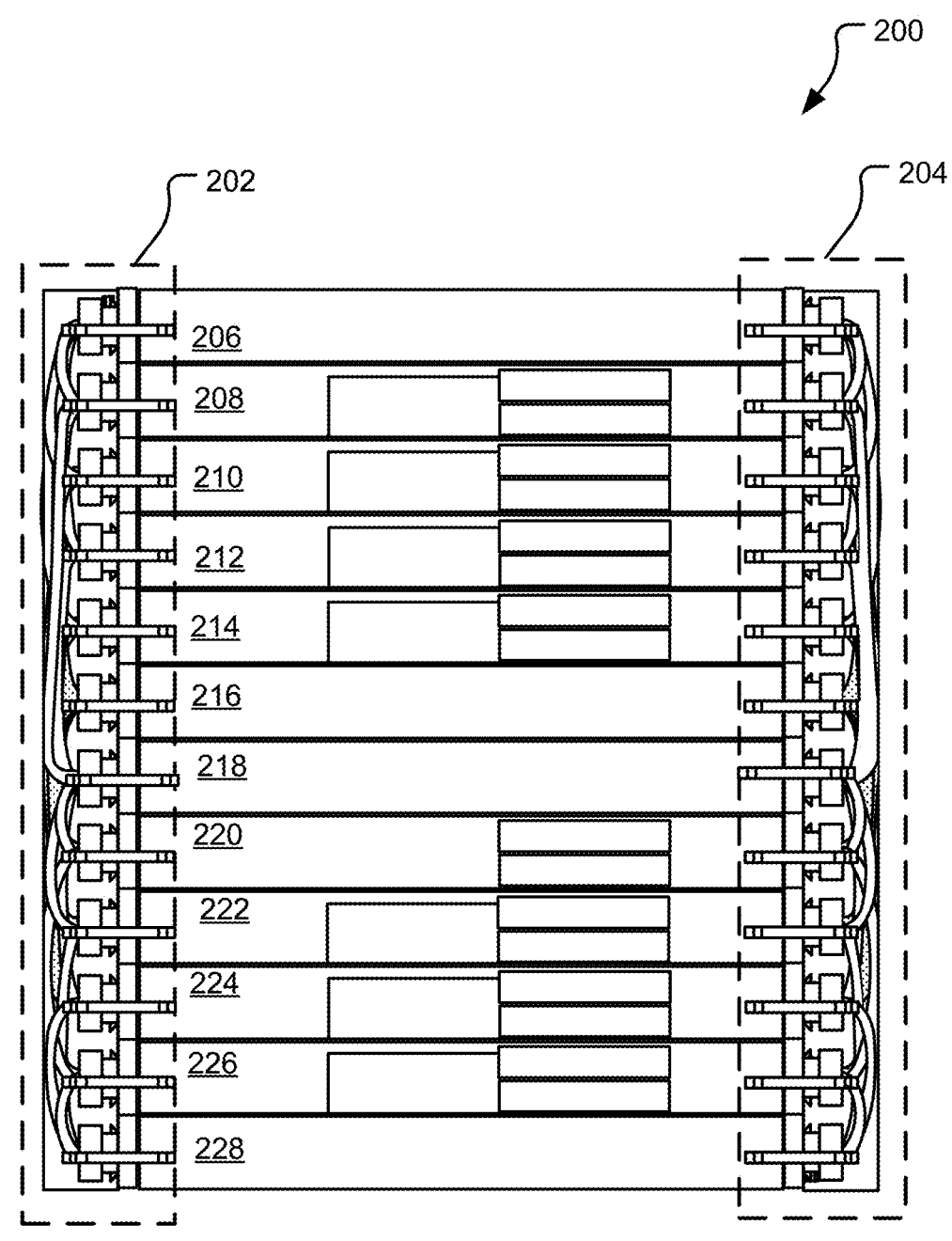
FIG. 2 illustrates a front side of an example chassis implementing a side plane connection design that provides electrical connectivity between different trays.

FIG. 2 illustrates a front side of an example chassis 200 implementing a side plane connection design that provides electrical connectivity between different trays (e.g., trays 206-226). The chassis 200 includes two side planes 202 and 204 that include connectors designed to couple to corresponding connectors that protrude outwardly from chassis trays (e.g., the trays 206-228. The trays are independently removable through the front side of the chassis 200 without severing connections formed on the side planes 202 and 204 and also without removing the side planes 202 and 204 from the chassis 200. Other aspects of the chassis 200 not described with respect to FIG. 2 may be the same or similar to features of other chassis described herein.

Figure 3:
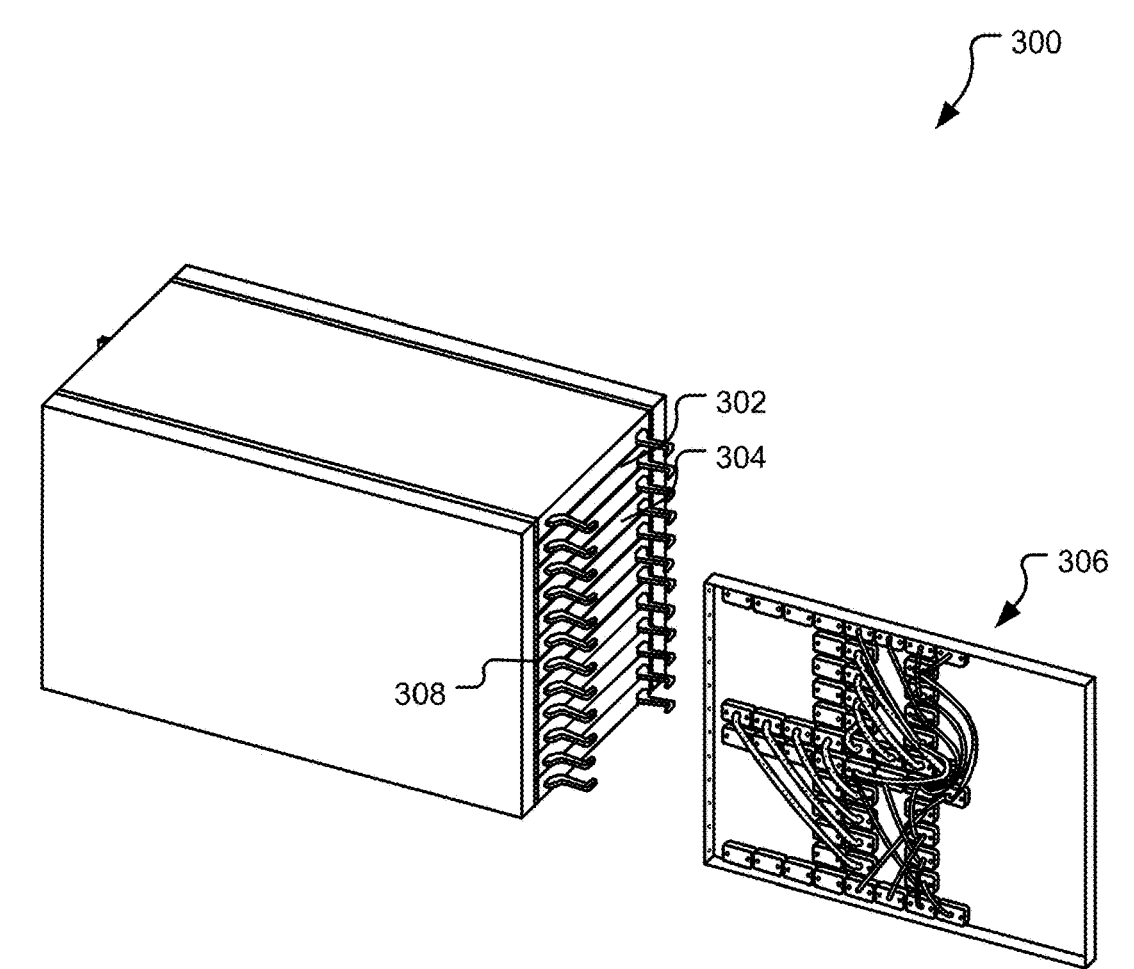
FIG. 3 illustrates a perspective view of an example chassis implementing the disclosed technology.

FIG. 3 illustrates a perspective view of an example chassis 300 implementing the disclosed technology. The chassis 300 includes trays (e.g., trays 302, 304) adapted to slide in and out of respective horizontally-oriented tray slots in the chassis 300. The chassis 300 further includes a side plane 306 adapted for insertion into a vertically-oriented panel slot 308 in the chassis 300. The side plane 306 is removeable from the chassis 300 and supports a number of electrical connectors (e.g., ports) that each provides electrical connectivity (e.g., via a cable) to another corresponding electrical connector on the side plane 306 that is positioned to electrically couple with a different respective one of the trays within the chassis. Other aspects of the trays (e.g., trays 302, 304) and side plane 306 that are not described explicitly with respect to FIG. 3 are assumed the same or similar to other implementations described herein.

Figure 4:
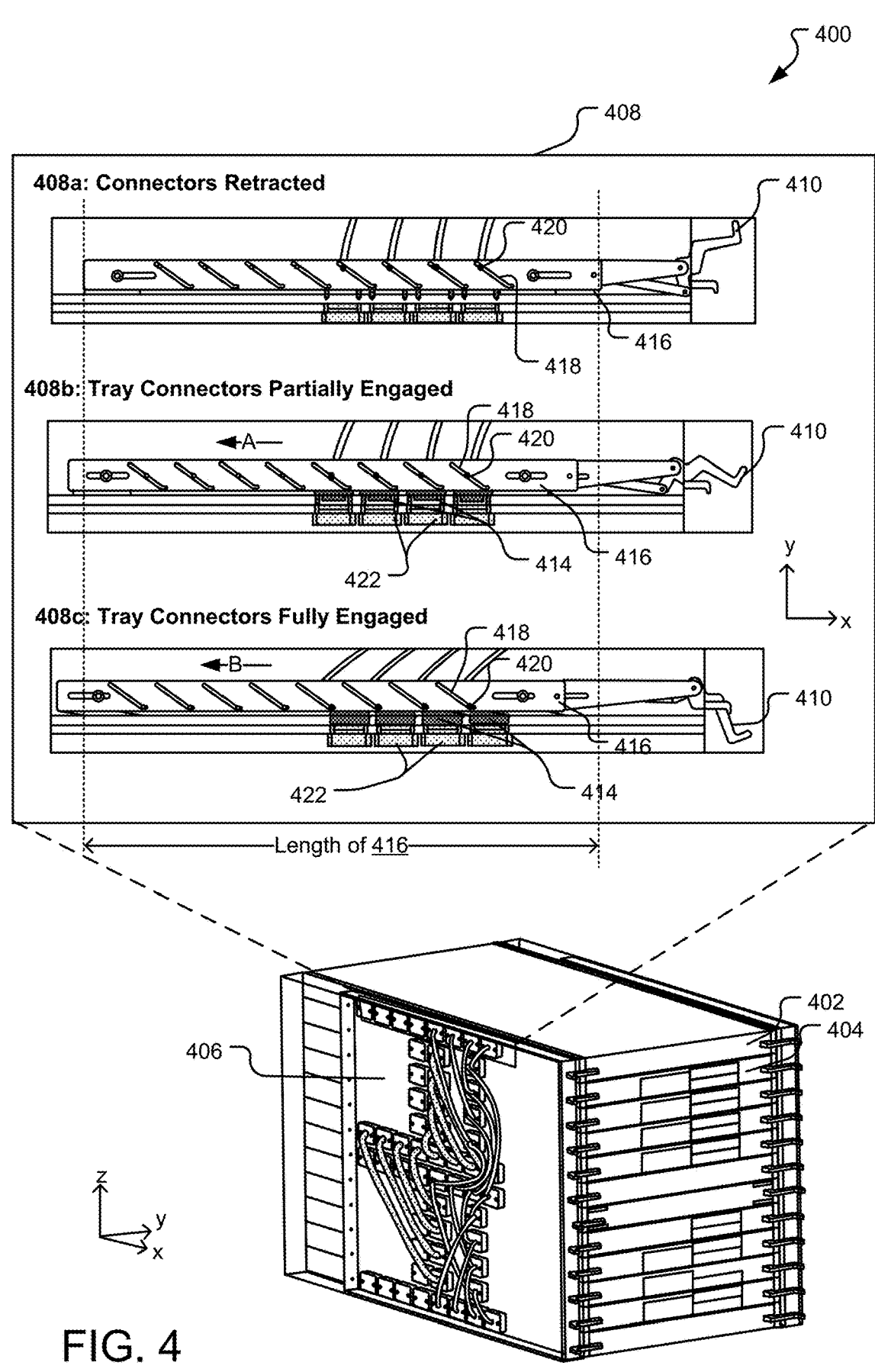
FIG. 4 illustrates further aspects of an example chassis implementing a side plane connection design with moveable tray-side connectors within each of multiple trays of the chassis.

FIG. 4 illustrates further aspects of an example chassis 400 implementing a side plane connection design with moveable tray-side connectors within each of multiple trays (e.g., trays 402, 404) of the chassis 400. The moveable tray-side connectors within each of the trays are adapted to mate with corresponding electrical ports (also referred to herein as "connectors") on a side plane 406 of the chassis 400. Cables are shown attached to pairs of the connectors on the side plane 406 at different heights, thereby providing electrical connectivity between various different trays in the chassis 400.

Each of the trays 402, 404 in the chassis 400 includes a rotatable lever (e.g., a lever 410 visible in expanded top-down views 408a, 408b, 408c) that can be selectably and bidirectionally engaged by a user to alter a position of moveable tray-side connectors within a corresponding tray of the chassis 400. between a retracted state and a protruded state.

The expanded views 408a, 408b, and 408c illustrate different positions of moveable tray-side connectors 414 within the tray 402 corresponding to different positions of the lever 410. The views 408a, 408b, and 408c correspond to a cross-section of a tray 402 in the chassis 400 when viewed from the top, with the illustrated cross-section corresponding to a slice along the x-y plane of the x-y-z coordinate system of the chassis 400 illustrated in FIG. 4.

As shown in views 408a, 408b, 408c, the lever 410 is attached (e.g., either directly or indirectly, such as via one or more mechanical linkages not visible in FIG. 4) to a slotted planar component 416. As the lever 410 is rotated consecutively from the respective positions illustrated in each of views 408a, 408b, and 408c, the slot planar component slides in a first direction (e.g., to the left) along the x-axis, also referred to herein as a "side plane axis." This directional movement of the slotted planar component 416 is illustrated by arrows A and B in views 408b and 408c, respectively.

Each of the moveable tray-side connectors 414 (visible in views 408b, 408c) is rigidly coupled to a connector pin (e.g., a connector pin 420) that protrudes through a corresponding slot (e.g., a slot 418) in the slotted planar component 416. The moveable tray-side connectors 414 are constrained from moving along the side plane axis (the x-axis) but adapted to move bidirectionally in a direction orthogonal to the side plane axis (e.g., in the y-axis direction per the axis labeling scheme of FIG. 4). Due to the fixed connection between the connector pin 420 and its corresponding moveable tray-side connector, sliding movement of the slot 418 relative to the connector pin 420 forces unified movement of the connector pin 420 and its corresponding moveable tray-side connector in the y-axis direction.

As the slotted planar component 416 moves consecutively between the positions illustrated in views 408a, 408b, and 408c, respectively (e.g. leftward movement), the movement of the slots (e.g., the slot 418) relative to the connector pins (e.g., the connector pin 420), pushes each pin along the length of its corresponding slot from the top of the slot (as shown in the view 408a) to the bottom of the slot (as shown in the view 408c). This movement of the connector pins within each of the slots in the slotted planar component 416 translates to corresponding y-direction movement of the moveable tray-side connectors 414.

In the view 408a, the lever 410 is in a first position and the moveable tray-side connectors 414 of the tray 402 are not visible because they are in a most-retracted position and thus tucked below the slotted planar component 416. In one implementation, an interlock (not shown) prevents the handle from moving from this position until the tray is fully seated within the outer chassis.

When the lever 410 is rotated from the position shown in the view 408a to the position shown in the view 408b, the slotted planar component 416 moves in the direction of arrow "A" by a first amount, causing the pins to shift in position within their corresponding slots (e.g., the pin 420 shifts within the slot 418) toward the sidewall of the tray 402. This shift in position of the pins within each slot causes a corresponding positional shift of the moveable tray-side connectors 414 such that the connectors now protrude slightly from the sidewall of the tray 402 and partially engage with corresponding side plane connectors 422 of the side plane 406. In one implementation, the position of the lever 410 in view 408b corresponds to a point in time in which guide pins (not shown) of the moveable tray-side connectors 414 first begin to couple with guide pin receptacles of the corresponding side plane connectors 422.

When the lever 410 is rotated from the position shown in the view 408b to the position shown in the view 408c, the slotted planar component 416 shifts further in the direction of arrow "B," causing the pins (e.g., the pin 420) to further shift in position within their corresponding slots, thereby further exposing the moveable tray-side connectors 414 on the exterior of the tray 402 such that the moveable tray-side connectors 414 have now fully engaged with the corresponding side plane connectors 422 of the side plane 406.

In the implementation of FIG. 4, the slots (e.g., slot 418) of the slotted planar component 416 are diagonal and substantially linear in shape such that an axis through the length of the slot forms a non-orthogonal angle with the side plane axis (e.g., parallel to the x-direction). In other implementations, such as those shown in FIG. 5-6, the slots are non-linear and of variable slope tailored to provide specific mechanical advantage to the moveable tray-side connectors 414 at select ranges of their extension.

Figure 5A:
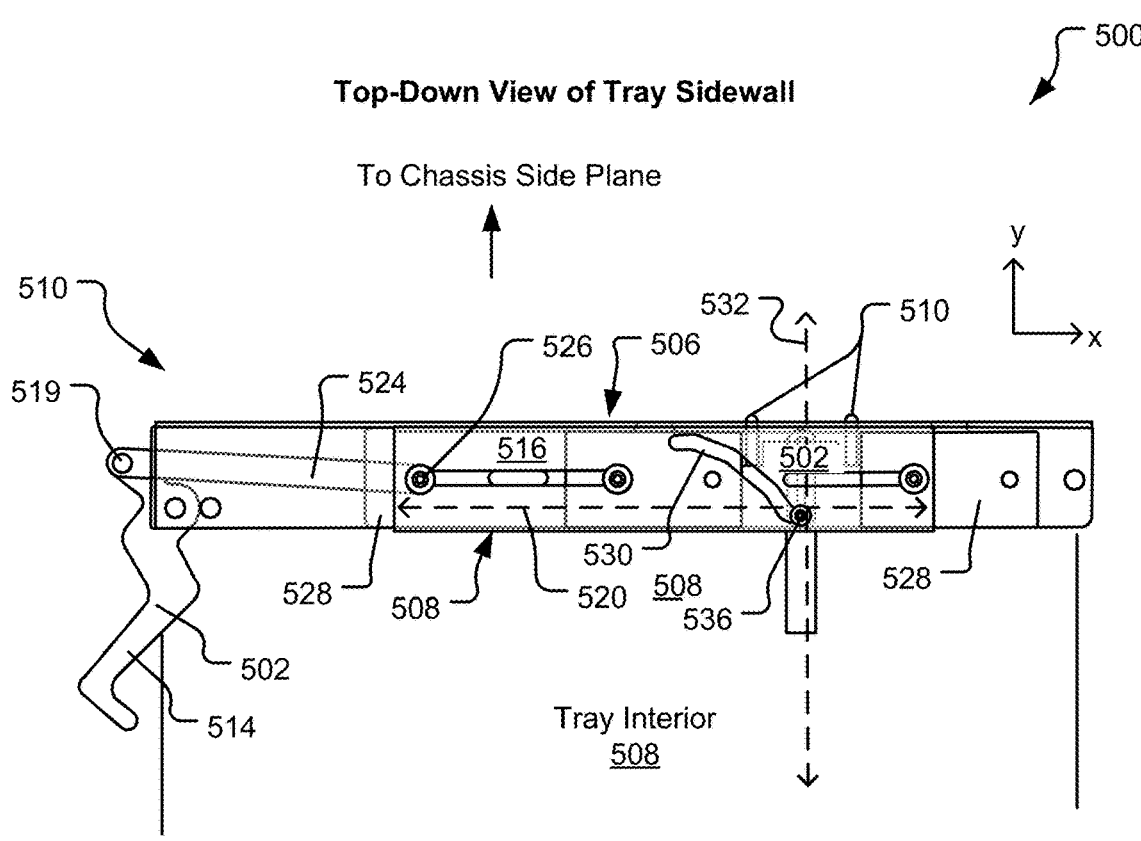
FIG. 5A illustrates a top-down view of a prototype mechanism for a tray with one moveable tray-side connector adapted for selective mating and unmating with corresponding connectors in a side plane of a chassis.

FIG. 5A illustrates a top-down view of a tray 500 containing a side plane engagement mechanism 510 with a moveable tray-side connector 502 adapted for selective mating and unmating with corresponding connectors in a side plane of a chassis (not shown), such as the chassis shown in FIG. 1A, FIG. 2, or FIG. 3. In FIG. 5A, various components of the side plane engagement mechanism 510 are shown transparent in order to better illustrate aspects of the moveable tray-side connector 502 and its respective functionality. The moveable tray-side connector 502 is, in the illustrated image, shown in a most-retracted positioned and underlying other components of the side plane engagement mechanism 510 including a slotted planar component 516. In this implementation the slotted planar component 516 is shown formed from sheet metal, with bent edges for added strength.

Guide pins 512 of the moveable tray-side connector 502 are just barely visible on an exterior side 506 of the tray 500. Although not shown, hardware resources of the tray 500 are positioned on a tray interior 508, and the tray 500 slides in and out of a corresponding tray slot in a chassis. When the tray 500 is inserted within the corresponding tray slot of the chassis, the exterior side 506 of the side plane engagement mechanism 510 faces a side plane (not shown) of the chassis with characteristics the same or similar to side plane 306 of FIG. 3.

The side plane engagement mechanism 510 of the tray 500 includes a slotted planar component 516 that is adapted to move along an axis 520 parallel to the exterior side 506 of the tray 500 in response to a rotational force applied to a lever 514, rotating about an axis through pivot point 519. This movement of the slotted planar component 516 is relative to underlying planar component 528 and the tray 500, each of which remains fixed in position as the lever 514 is rotated. A low-friction layer or coating 537 may be present beneath the slotted planar component 516.

The lever 514 is attached to a linkage 524, and the linkage 524 is to fixedly (e.g., non-slidably) attached the slotted planar component 516 by one or more fixed pins 526 that extend from the linkage 524 and through the slotted planar component 516. Rotational movement of the lever 514 moves the linkage 524 along the side plane axis 520 and thereby forcibly slides the slotted planar component 516 in the same direction by a corresponding amount.

The slotted planar component 516 includes an angled slot 530 that is slidably coupled to a connector pin 536 that protrudes from and is fixedly attached to the moveable tray-side connector 502. The angled slot 530 and connector pin 536 are collectively referred to herein as a "bar and slot assembly." A bushing or low friction surface between the pin 536 and slot 530 may reduce friction between the pin and slot.

When the slotted planar component 516 slides along the side plane axis 520 relative to the underlying planar component 528, the connector pin 536 does not move relative to the side plane axis 520. However, the connector pin 536 and moveable connector 502 are free to move along a connector movement axis 532 orthogonal to the side plane axis 520. Consequently, the sliding movement of the angled slot 530 relative to the connector pin 536 imparts movement on the connector pin 536 in direction of the connector movement axis 532.

In the implementation shown, rightward movement of the slotted planar component 516 forces the connector pin 536 and the movable tray-side connector 502 in unison outward toward the chassis sidewall (toward the top of FIG. 5A) along the movement axis 532 until the connector pin 536 reaches the opposite end of the slot proximal to the exterior side 506 of the side plane engagement mechanism 510. From this position, leftward movement of the slotted planar component 516 forces the connector pin 536 and the movable tray-side connector 502 in unison inward toward the tray interior 508 until the original (illustrated) position is reached.

Figure 5B:
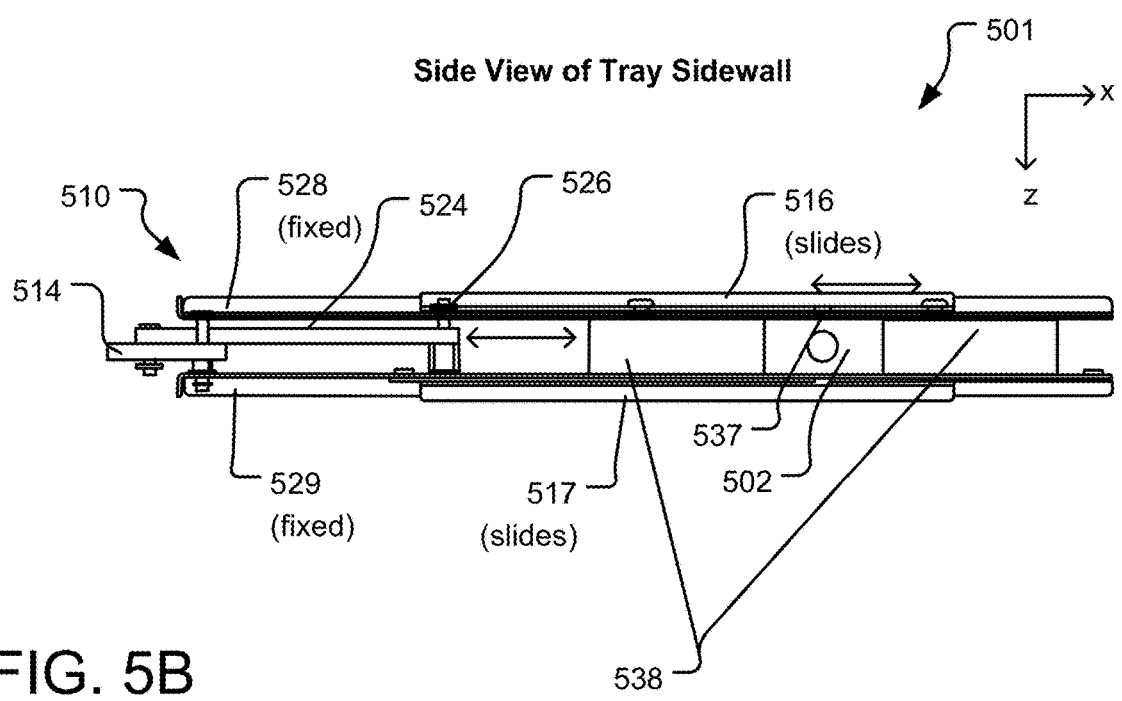
FIG. 5B illustrates a side-on view of the mechanism of FIG. 5A.

In the implementation of FIG. 5A-5B, the angled slot 530 is oriented in a generally diagonal direction relative to the side plane axis 520. The angled slot 530 also has a variable slope that is specifically tailored to alter mechanical advantage of the bar in slot assembly at specific locations of connector pin 536 within the angled slot 530 in response to a constant human-applied force acting on the lever 514.

It is widely understood that the force required to mate electrical connectors increases while the connectors are mating (e.g., with force increasing as the surface area of contact increases between the connectors. For electrical connectors, this increased force is due to friction between and motion of the electrical contacts in the mating connectors. In a typical scenario, two electrical connectors are initially brought together to a point where guide pins engage to provide a coarse alignment between the electrical connectors. Systems typically allow for float, or motion between the two connectors, to account for any offsets or misalignment between the connectors. After this point of initial contact between the guide pins and corresponding receptacles, more force may be required to align the connectors. To continue the mating, the user has to overcome the force needed to mate the two connectors. The maximum force required to complete the mating is known as the "peak mating force." The peak mating force of needed to mate a single pair of connectors increases as a multiple of the number of electrical contacts being simultaneously connected. A single pair of electrical contacts may require less than one pound of force. This side plane mechanism may be used for high-speed electrical connectors, electrical power connectors, or liquid line connections.

In FIG. 5A, the use of the lever 514 as the force application mechanism provides some mechanical advantage that reduces the human-applied force needed to achieve a given quantity of force against the movement connector 502 along the movement axis 532. At any given position of the connector pin 536 within the angled slot 530, the slope of the angled slot 530 directly influences the magnitude of this mechanical advantage. The angled slot 530 is therefore deliberately tailored in shape to ensure that a greater mechanical advantage is provided when the mating between the moveable connector 502 and side plane connector (not shown) is nearly complete—e.g., during a final fraction (e.g., last 25% or so) of the range of the connector's range of motion. In the illustrated implementation, the slope of the angled slot 530 relative to the side plane axis 520 is greater in a first region proximal to the tray interior 508 than in a second region distal from the tray interior 508 (e.g., that is comparatively closer to the exterior side 506 of the tray 500).

In application, the slope of the angled slot 530 is greatest as the connector first begins to transition from the fully retracted position (as illustrated) to a protruded position. Once the moveable connector 502 is more than halfway through this range of motion, the slope of the angled slot 530 decreases, which translates to an increased mechanical advantage—meaning, the same magnitude of user-applied force translates to an increased outward force on the moveable connector 502.

The above-described variable slope design for the angled slot 530 ensure that the moveable connector 502 can be mated with a side plane connector (not shown) with a lesser human-applied force (e.g., to the lever 514) as compared to the human-applied force that is needed slot in designs with a linear slot, as shown in FIG. 3. This increased mechanical advantage may be particularly useful in designs that incorporate many bar-in-slot assemblies in a single tray to move many moveable connectors in unison in response to movement on the lever.

FIG. 5B illustrates a side-on view 501 of the side plane engagement mechanism 510 of the tray 500 of FIG. 5A as viewed from the interior of the tray 500 (e.g., from the center of the tray 500 looking out at the side plane engagement mechanism 510). The side-on view 501 better illustrates linkages between the lever 514, linkage 524, and fixed pin 526 that fixedly couples the linkage 524 to the slotted planar component 516. Due to this fixed coupling, rotational movement of the lever 514 shifts the linkage along the side plane axis 520 and shifts the slotted planar component 516 by a corresponding amount relative to the underlying planar component(s) 528, which remains fixed. While the slotted planar component 516 is moved along the x direction, the moveable connector 502 and fixed pin 526 move in unison in the y-direction (e.g., into and out of the page in FIG. 5B) due to relative movement of the fixed pin 526 and the angled slot (not shown in FIG. 5B) in the slotted planar component 516.

In the side view of FIG. 5B, the slotted planar component 516 is mirrored by an additional moving component 517 on the underside of the side plane engagement mechanism 510. The additional moving planar component 517 is similar or identical in shape to the slotted planar component 516 and moves in unison with the slotted planar component 516. The view of FIG. 5B additionally shows an additional underlying planar component(s) 529 that mirror the structure and function of the underlaying planar component(s) 528. The underlying planar components 528, 529 remain fixed in position while the slotted planar component 516 and the additional moving planar component 517 move in unison while separated from one another by structural components 538.

Figure 6:
FIG. 6 illustrates a top-down cross-sectional view of an example chassis illustrating a mated connection formed between a tray and a chassis side plane.
Figure 6:
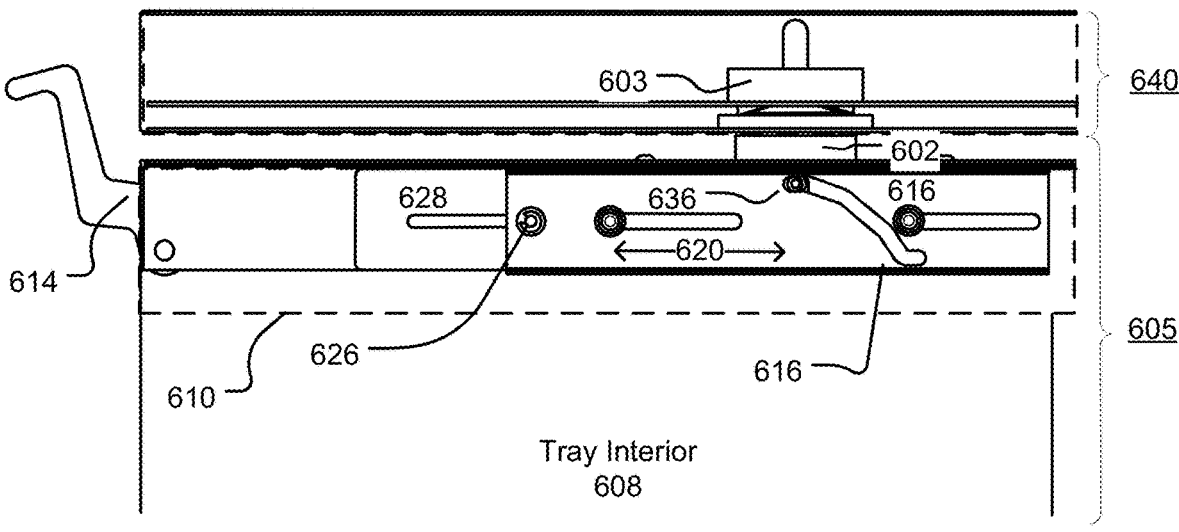

FIG. 6 illustrates a top-down cross-sectional view of an example chassis 600 illustrating a mated connection formed between a tray 605 and a chassis side plane 640. Specifically, the mated connection is formed between a moveable connector 602 in a side plane portion 610 of the tray 605 and a connector 603 mounted on the chassis side plane 640.

Components of the side plane portion 610 of the tray function the same or similar to corresponding components described with respect to FIG. 5A-5B. Specifically, the tray 605 includes a lever 614 attached to a slotted planar component 616 via one or more linkages (not shown) and fixed pin 626. When a user applies a force to the lever 614, the rotation of the lever 614 causes the slotted planar component 616 to slide along a side plane axis 620 relative to underlying planar component 628 and relative to the moveable connector 602. The moveable connector 602 is fixedly attached to a connector pin 636 slidably coupled to a slot 630 in the slotted planar component 616. As the slotted planar component 616 slides along the side plane axis 620, the connector pin 636 and moveable connector 602 are pushed outward from the tray 605 toward the chassis exterior (e.g., in a direction orthogonal direction to the side plane axis 620), until the connector pin 636 reaches the illustrated position.

Provided that both the tray 605 and the chassis side plane 640 are positioned within a chassis (e.g., as generally shown with respect to FIG. 1A), the above-described rotation of the lever 614 causes the moveable connector 602 to mate with the connector 603 on the chassis side plane 640 as shown.

FIG. 7 illustrates example operation 700 for engaging a compute resource tray (e.g., a server tray or a tray storing resources utilize by a server) with a chassis side plane according to an aspect of the herein disclosed technology. A first lever rotation operation 702 rotates a lever on the tray in a first direction to cause a moveable connector on a sidewall of the tray to retract inward toward the tray and to an inward-most position. While the moveable connector remains stowed at the inward-most position, an insertion operation 704 inserts the tray into a tray slot on a front side of a chassis. When the tray is inserted within the tray slot, the lever remains accessible to a user positioned (e.g., standing) proximal to the front side of the chassis. While the tray remains inserted in the tray slot, a second lever rotation operation 706 rotates the lever in a second direction (e.g., opposite the first direction) to cause the moveable connector of the tray to begin moving outward away from the sidewall of the tray and into engagement with a side plane of the chassis. For example, the moveable connector moves into engagement with an electrical connector attached to a chassis side plane, and this establishes an electrical coupling between the moveable connector of the tray and the chassis side plane.

In some aspects, the techniques described herein relate to a system including: a tray adapted for insertion into a tray slot in a front side of a chassis, the tray including: a lever; and a moveable connector that protrudes from a sidewall of the tray and that engages with a side plane of the chassis in response to rotation of the lever.

In some aspects, the techniques described herein relate to a system, wherein: the lever is accessible on the front side of the chassis when the tray is positioned in the tray slot, and wherein: the moveable connector is adapted to: protrude outward from the sidewall of the tray in response to rotation of the lever in a first direction; and retract inward and at least partially into the sidewall in response to rotation of the lever in a second direction opposite the first direction.

In some aspects, the techniques described herein relate to a system, further including: a chassis side plane adapted for insertion into a panel slot that is within the chassis and substantially orthogonal to the tray slot, the chassis side plane including a connector port adapted to receive the moveable connector of the tray in response to rotation of the lever.

In some aspects, the techniques described herein relate to a system, wherein the chassis side plane extends parallel to the sidewall of the tray and to sidewalls of multiple other trays positioned within the chassis, and wherein the chassis side plane includes multiple other connector ports adapted to receive and mate with moveable connectors that protrude from multiple of other trays in the chassis to facilitate electrical connects between various ports in various trays.

In some aspects, the techniques described herein relate to a system, wherein the lever is attached to a slotted planar component that includes a slot slidably coupled to a connector pin fixedly attached to the moveable connector, the slotted planar component being adapted to slide along a side plane axis parallel to a chassis side plane in response to rotational movement of the lever.

In some aspects, the techniques described herein relate to a system, wherein the slot forms a non-orthogonal angle with the side plane axis and movement of the slotted planar component along the side plane axis forces movement of the connector pin and the moveable connector in a direction orthogonal to the side plane axis.

In some aspects, the techniques described herein relate to a system, where the slot has variable slope designed to increase mechanical advantage acting on the moveable connector as the moveable connector is moved outward from the sidewall of the tray.

In some aspects, the techniques described herein relate to a system, wherein the slot has a slope defined relative to the side plane axis, the slope being greater in a first region proximal to a tray interior than in a second region distal from the tray interior.

In some aspects, the techniques described herein relate to a method including: rotating a lever on a tray in a first direction to cause a moveable connector on a sidewall of the tray to retract inward toward the tray and to an inward-most position; while the moveable connector is stowed at the inward-most position, insert the tray into a tray slot on a front side of a chassis with the lever remaining accessible from the front side of the chassis; while the tray remains inserted within the tray slot, rotation the lever in a second direction to cause the moveable connector of the tray to protrude outward from the sidewall of the tray and move into engagement with a chassis side plane.

In some aspects, the techniques described herein relate to a method, further including: rotating the lever on a tray back in the first direction to cause the moveable connector to retract inward toward the tray and to the inward-most position; and removing the tray from the chassis while the moveable connector is at the inward-most position.

In some aspects, the techniques described herein relate to a method, wherein the chassis side plane is substantially orthogonal to the tray slot and includes a connector port adapted to receive the moveable connector of the tray and to mate with the moveable connector when the moveable connector is at an outward-most position relative to the sidewall of the tray.

In some aspects, the techniques described herein relate to a method, wherein the chassis side plane extends parallel to the sidewall of the tray and to sidewalls of multiple other trays positioned within the chassis, and wherein the chassis side plane includes multiple other connector ports adapted to receive and mate with moveable connectors that protrude from multiple of other trays in the chassis to facilitate electrical connects between various ports in various trays.

In some aspects, the techniques described herein relate to a method, wherein the lever is attached to a slotted planar component that includes a slot slidably coupled to a connector pin fixedly attached to the moveable connector, the slotted planar component being adapted to slide along a side plane axis parallel to a chassis side plane in response to rotational movement of the lever.

In some aspects, the techniques described herein relate to a method, wherein the slot forms a non-orthogonal angle with the side plane axis and movement of the slotted planar component along the side plane axis forces movement of the connector pin and the moveable connector in a direction orthogonal to the side plane axis.

In some aspects, the techniques described herein relate to a method, wherein the slot has a slope defined relative to the side plane axis, the slope being greater in a first region proximal to a tray interior than in a second region distal from the tray interior.

In some aspects, the techniques described herein relate to a method, wherein the moveable connector and the connector pin are fixed in position along the side plane axis and adapted to move in a plane orthogonal to the side plane axis.

In some aspects, the techniques described herein relate to a system including: a chassis including a plurality of tray slots; a tray adapted for insertion within a tray slot of the plurality of tray slots, the tray including: a front wall that includes a lever accessible on a front side of the chassis when the tray is positioned in the tray slot; a sidewall substantially orthogonal to the front wall that rests internal to the chassis when the tray is positioned within the tray slot; and a moveable connector adapted to move in a direction orthogonal to the sidewall of the tray in response to rotation of the lever, the rotation of the lever driving a pin-in-slot assembly that forcibly slides a planar component with a slot relative to a connector pin positioned within the slot and attached to the moveable connector.

In some aspects, the techniques described herein relate to a system, wherein rotation of the lever in a first direction forcibly slides a slotted planar component in a first direction to drive the connector pin away outward away from an interior of the tray and wherein the rotation of the lever in a second opposite direction forcibly slides the slotted planar component in a second opposite direction to drive the connector pin to inward toward the interior of the tray.

In some aspects, the techniques described herein relate to a system, wherein the slot has a slope defined relative to a movement axis of the slotted planar component, the slope being greater in a first region proximal to a tray interior than in a second region distal from the tray interior.

In some aspects, the techniques described herein relate to a system, further including a chassis side plane adapted for insertion into a panel slot that is within the chassis and substantially orthogonal to the plurality of tray slots, the chassis side plane including a connector port adapted to receive the moveable connector of the tray in response to rotation of the lever.

Some implementations may comprise an article of manufacture. An article of manufacture may comprise a tangible storage medium (a memory device) to store logic. Examples of a storage medium may include one or more types of processor-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, operation segments, methods, procedures, software interfaces, application program interfaces (API), instruction sets, computing code, computer code, code segments, computer code segments, words, values, symbols, or any combination thereof. In one implementation, for example, an article of manufacture may store executable computer program instructions that, when executed by a computer, cause the computer to perform methods and/or operations in accordance with the described implementations. The executable computer program instructions may include any suitable type of code, such as source code, compiled code, interpreted code, executable code, static code, dynamic code, and the like. The executable computer program instructions may be implemented according to a predefined computer language, manner, or syntax, for instructing a computer to perform a certain operation segment. The instructions may be implemented using any suitable high-level, low-level, object-oriented, visual, compiled and/or interpreted programming language.

The logical operations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language. The above specification, examples, and data, together with the attached appendices, provide a complete description of the structure and use of exemplary implementations.

The above specification, examples, and data, together with the attached appendices, provide a complete description of the structure and use of example implementations.

What is claimed is:

1. A system comprising:
a tray adapted for insertion into a tray slot in a front side of a chassis, the tray including:
a lever;
a moveable connector that protrudes from a sidewall of the tray in response to rotation of the lever; and
a chassis side plane adapted for insertion into a panel slot that is within the chassis and substantially orthogonal to the tray slot, the chassis side plane including a connector port adapted to receive the moveable connector of the tray in response to rotation of the lever, wherein the chassis side plane includes multiple other connector ports adapted to receive and mate with moveable connectors that protrude from multiple of other trays in the chassis to facilitate electrical connects between various ports in various trays.

2. The system of claim 1, wherein:
the lever is accessible on the front side of the chassis when the tray is positioned in the tray slot, and wherein:
the moveable connector is adapted to:
protrude outward from the sidewall of the tray in response to rotation of the lever in a first direction; and
retract inward and at least partially into the sidewall in response to rotation of the lever in a second direction opposite the first direction.

3. The system of claim 1, wherein the chassis side plane extends parallel to the sidewall of the tray and to sidewalls of multiple other trays positioned within the chassis.

4. The system of claim 1, wherein the lever is attached to a slotted planar component that includes a slot slidably coupled to a connector pin fixedly attached to the moveable connector, the slotted planar component being adapted to slide along a side plane axis parallel to a chassis side plane in response to rotational movement of the lever.

5. The system of claim 4, wherein the slot forms a non-orthogonal angle with the side plane axis and movement of the slotted planar component along the side plane axis forces movement of the connector pin and the moveable connector in a direction orthogonal to the side plane axis.

6. The system of claim 4, where the slot has variable slope designed to increase mechanical advantage acting on the moveable connector as the moveable connector is moved outward from the sidewall of the tray.

7. The system of claim 6, wherein the slot has a slope defined relative to the side plane axis, the slope being greater in a first region proximal to a tray interior than in a second region distal from the tray interior.

8. A method comprising:
rotating a lever on a tray in a first direction to cause a moveable connector on a sidewall of the tray to retract inward toward the tray and to an inward-most position;
while the moveable connector is stowed at the inward-most position, insert the tray into a tray slot on a front side of a chassis with the lever remaining accessible from the front side of the chassis;
while the tray remains inserted within the tray slot, rotating the lever in a second direction to cause the moveable connector of the tray to protrude outward from the sidewall of the tray and move into engagement with a connector port on a chassis side plane, the chassis side plane positioned within the chassis and substantially orthogonal to the tray slot, wherein the chassis side plane includes multiple other connector ports adapted to receive and mate with moveable connectors that protrude from multiple of other trays in the chassis to facilitate electrical connects between various ports in various trays.

9. The method of claim 8, further comprising:
rotating the lever on the tray back in the first direction to cause the moveable connector to retract inward toward the tray and to the inward-most position; and
removing the tray from the chassis while the moveable connector is at the inward-most position.

10. The method of claim 8, wherein the connector port is adapted to mate with the moveable connector when the moveable connector is at an outward-most position relative to the sidewall of the tray.

11. The method of claim 10, wherein the chassis side plane extends parallel to the sidewall of the tray and to sidewalls of multiple other trays positioned within the chassis.

12. The method of claim 10, wherein the lever is attached to a slotted planar component that includes a slot slidably coupled to a connector pin fixedly attached to the moveable connector, the slotted planar component being adapted to slide along a side plane axis parallel to a chassis side plane in response to rotational movement of the lever.

13. The method of claim 12, wherein the slot forms a non-orthogonal angle with the side plane axis and movement of the slotted planar component along the side plane axis forces movement of the connector pin and the moveable connector in a direction orthogonal to the side plane axis.

14. The method of claim 12, wherein the slot has a slope defined relative to the side plane axis, the slope being greater in a first region proximal to a tray interior than in a second region distal from the tray interior.

15. The method of claim 12, wherein the moveable connector and the connector pin are fixed in position along the side plane axis and adapted to move in a plane orthogonal to the side plane axis.

16. A system comprising:
a chassis including a plurality of tray slots;
a tray adapted for insertion within a tray slot of the plurality of tray slots, the tray including:
a front wall that includes a lever accessible on a front side of the chassis when the tray is positioned in the tray slot;
a sidewall substantially orthogonal to the front wall that rests internal to the chassis when the tray is positioned within the tray slot; and
a moveable connector adapted to move in a direction orthogonal to the sidewall of the tray in response to rotation of the lever, the rotation of the lever driving a pin-in-slot assembly that forcibly slides a planar component with a slot relative to a connector pin positioned within the slot and attached to the moveable connector.

17. The system of claim 16, wherein rotation of the lever in a first direction forcibly slides the planar component with the slot in a first direction to drive the connector pin away outward away from an interior of the tray and wherein rotation of the lever in a second opposite direction forcibly slides the slotted planar component in a second opposite direction to drive the connector pin to inward toward the interior of the tray.

18. The system of claim 16, wherein the slot has a slope defined relative to a movement axis of the planar component with the slot, the slope being greater in a first region proximal to a tray interior than in a second region distal from the tray interior.

19. The system of claim 16, further comprising a chassis side plane adapted for insertion into a panel slot that is within the chassis and substantially orthogonal to the plurality of tray slots, the chassis side plane including a connector port adapted to receive the moveable connector of the tray in response to rotation of the lever.

\* \* \* \* \*